US008664050B2

(12) United States Patent
Cheng et al.

(10) Patent No.: US 8,664,050 B2
(45) Date of Patent: Mar. 4, 2014

(54) STRUCTURE AND METHOD TO IMPROVE ETSOI MOSFETS WITH BACK GATE

(75) Inventors: Kangguo Cheng, Albany, NY (US); Bruce B. Doris, Albany, NY (US); Balasubramanian S. Haran, Albany, NY (US); Ali Khakifirooz, San Jose, CA (US); Pranita Kulkarni, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/424,447

(22) Filed: Mar. 20, 2012

(65) Prior Publication Data

US 2013/0249002 A1   Sep. 26, 2013

(51) Int. Cl.
*H01L 29/78* (2006.01)
*H01L 21/336* (2006.01)

(52) U.S. Cl.
USPC ........... 438/151; 257/347; 257/503; 257/510; 257/E29.255; 257/E21.409; 438/294; 438/296; 438/424; 438/427

(58) Field of Classification Search
CPC ..................... H01L 21/02038; H01L 21/7624; H01L 27/1203; H01L 21/762; H01L 21/76205; H01L 21/7621; H01L 21/76224; H01L 21/76232; H01L 21/76229; H01L 21/76; H01L 21/76264
USPC .......................................................... 438/151
See application file for complete search history.

(56) References Cited

U.S. PATENT DOCUMENTS

| | | | |
|---|---|---|---|
| 5,913,124 A * | 6/1999 | Lin et al. | 438/302 |
| 5,973,373 A * | 10/1999 | Krautschneider et al. | 257/390 |
| 6,133,105 A * | 10/2000 | Chen et al. | 438/296 |
| 6,235,606 B1 * | 5/2001 | Huang et al. | 438/400 |
| 6,294,823 B1 * | 9/2001 | Arafa et al. | 257/510 |
| 6,303,465 B1 * | 10/2001 | Liao | 438/424 |
| 6,483,142 B1 * | 11/2002 | Hsue et al. | 257/306 |
| 6,509,232 B1 * | 1/2003 | Kim et al. | 438/264 |
| 6,521,493 B1 | 2/2003 | Alsmeier et al. | |
| 6,531,737 B2 * | 3/2003 | Okada et al. | 257/344 |
| 6,649,964 B2 | 11/2003 | Kim | |
| 6,653,194 B1 * | 11/2003 | Park | 438/296 |
| 6,750,116 B1 | 6/2004 | Chen | |
| 6,828,171 B2 * | 12/2004 | Kubby | 438/31 |
| 7,098,515 B1 * | 8/2006 | Gu et al. | 257/397 |

(Continued)

OTHER PUBLICATIONS

K. Cheng et al., "Extremely thin SOI (ETSOI) technology: Past, present, and future", Oct. 11-14, 2010, SOI Conference (SOI), IEEE International, pp. 1-4.*

*Primary Examiner* — Kevin Parendo
*Assistant Examiner* — Pauline Vu
(74) *Attorney, Agent, or Firm* — Cantor Colburn LLP; Vazken Alexanian

(57) ABSTRACT

A structure and method to improve ETSOI MOSFET devices. A wafer is provided including regions with at least a first semiconductor layer overlying an oxide layer overlying a second semiconductor layer. The regions are separated by a STI which extends at least partially into the second semiconductor layer and is partially filled with a dielectric. A gate structure is formed over the first semiconductor layer and during the wet cleans involved, the STI divot erodes until it is at a level below the oxide layer. Another dielectric layer is deposited over the device and a hole is etched to reach source and drain regions. The hole is not fully landed, extending at least partially into the STI, and an insulating material is deposited in said hole.

9 Claims, 4 Drawing Sheets

(56) References Cited

U.S. PATENT DOCUMENTS

| | | | |
|---|---|---|---|
| 7,129,142 B2 * | 10/2006 | Wristers et al. | 438/305 |
| 7,202,123 B1 | 4/2007 | Pan | |
| 7,306,997 B2 | 12/2007 | Xiang et al. | |
| 7,323,748 B2 * | 1/2008 | Yamada et al. | 257/347 |
| 7,442,619 B2 * | 10/2008 | Luo et al. | 438/430 |
| 7,491,964 B2 * | 2/2009 | Buehrer et al. | 257/3 |
| 7,671,413 B2 * | 3/2010 | Furukawa | 257/347 |
| 7,727,856 B2 | 6/2010 | Teo et al. | |
| 7,737,526 B2 | 6/2010 | Williams et al. | |
| 7,763,510 B1 | 7/2010 | Zhang et al. | |
| 7,772,649 B2 * | 8/2010 | Cheng et al. | 257/354 |
| 7,871,869 B2 | 1/2011 | Cartier et al. | |
| 7,923,782 B2 * | 4/2011 | Zhu et al. | 257/349 |
| 2001/0009805 A1 * | 7/2001 | Ha et al. | 438/637 |
| 2003/0205813 A1 * | 11/2003 | Saitoh | 257/758 |
| 2006/0160363 A1 * | 7/2006 | Furukawa et al. | 438/704 |
| 2006/0205164 A1 * | 9/2006 | Ko et al. | 438/296 |
| 2007/0066000 A1 * | 3/2007 | Muramatsu | 438/197 |
| 2008/0124876 A1 * | 5/2008 | Ryu | 438/296 |
| 2008/0217702 A1 * | 9/2008 | Oishi | 257/397 |
| 2009/0309163 A1 * | 12/2009 | Wang et al. | 257/369 |
| 2010/0258869 A1 * | 10/2010 | Morita et al. | 257/347 |
| 2012/0168863 A1 * | 7/2012 | Zhu et al. | 257/347 |
| 2012/0292700 A1 * | 11/2012 | Khakifirooz et al. | 257/347 |
| 2013/0026570 A1 * | 1/2013 | Fan et al. | 257/347 |

* cited by examiner

STRUCTURE AND METHOD TO IMPROVE ETSOI MOSFETS WITH BACK GATE

BACKGROUND OF THE INVENTION

1. Field of the Invention

The present invention generally relates to semiconductor devices, and more specifically to improving ETSOI MOSFETS.

2. Description of Related Art

Metal Oxide Semiconductor Field Effect Transistors (MOSFETS) are commonly used today in almost all electronic circuit applications. An emerging technology in the field of semiconductor-on-insulator (SOI) FET devices is the extremely thin semiconductor-on-insulator (ETSOI) MOSFET. Such a device shows excellent short channel control, which is desirable. With the trend toward continued scaling of MOSFET devices, ETSOI is a promising candidate for next generation technology.

There are, however, several manufacturing issues that can limit yield. Specifically, as the STI divot erodes as a function of the HF based cleaning and other process steps during manufacturing, the back gate or substrate wafer is exposed, leaving it susceptible to shorting due to s/d epitaxy and unwanted metal gate connections, among other processes.

BRIEF SUMMARY OF THE INVENTION

To overcome these deficiencies, the present invention provides a method of manufacturing a semiconductor device, including: providing a wafer including a plurality of regions including at least a first semiconductor layer overlying an oxide layer overlying a second semiconductor layer, separated by at least one shallow trench isolation extending at least partially into the second semiconductor layer and containing a first dielectric, wherein the first dielectric includes divots adjacent to and below the sidewall of the oxide layer; forming a gate structure directly over the first semiconductor layer; depositing a second dielectric uniformly over the device; etching a hole adjacent and parallel to the gate structure into the second dielectric, wherein the contact hole is not fully landed and extends at least partially into the shallow trench isolation; and, depositing an insulating material film that can be etched selective to the second dielectric in the hole, wherein at least the portion adjacent to and below the first semiconductor layer is completely filled.

According to another aspect, the present invention provides a semiconductor device including: a wafer including a plurality of regions including at least a first semiconductor layer overlying an oxide layer overlying a second semiconductor layer, separated by at least one shallow trench isolation extending at least partially into the second semiconductor layer and containing a first dielectric, wherein the first dielectric includes divots adjacent to and below the sidewall of the oxide layer; a gate structure overlying the first semiconductor layer; a second dielectric material with an even top surface completely covering the device; a hole etched into the second dielectric material, wherein the hole is not fully landed and extends at least partially into the shallow trench isolation; an insulating material that fills the hole, from the top of the second semiconductor layer extending down to the first dielectric material, wherein the insulating material has physical properties that allow it to be etched selective to the second dielectric material; and, a metal material filling the rest of the hole.

According to yet another aspect, the present invention provides an integrated circuit including: a wafer including a plurality of regions including at least a first semiconductor layer overlying an oxide layer overlying a second semiconductor layer, separated by at least one shallow trench isolation extending at least partially into the second semiconductor layer and containing a first dielectric, wherein the first dielectric includes divots adjacent to and below the sidewall of the oxide layer; a gate structure overlying the first semiconductor layer, wherein at least the gate structure of one region is electrically connected to at least the gate structure of one other region to form an integrated circuit; a second dielectric material with a uniform top surface completely covering the wafer; a hole etched into the second dielectric material, wherein the hole is not fully landed and extends at least partially into the shallow trench isolation; an insulating material that fills the hole, from the top of the second semiconductor layer extending down to the first dielectric material, wherein the insulating material has physical properties that allow it to be etched selective to the second dielectric material; and, a metal filling the rest of the hole.

DETAILED DESCRIPTION OF THE PREFERRED EMBODIMENTS

Figure 1:
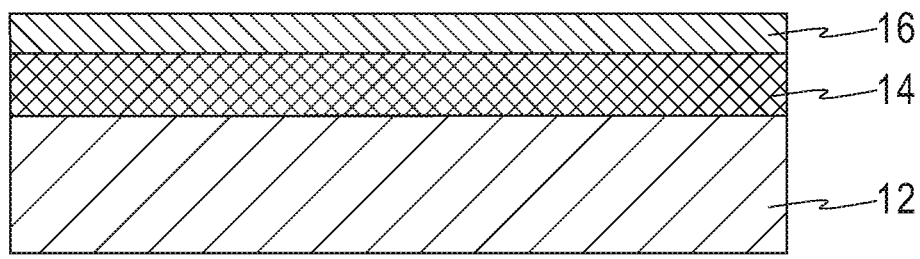
FIG. 1 is a cross-sectional view of an ETSOI substrate according to an embodiment of the present invention.

FIGS. 1-9 depict one embodiment of a method of fabricating an improved ETSOI MOSFET. Referring now to FIG. 1, a semiconductor device in an initial stage of development is shown. Semiconductor layer 16 represents a thin layer of semiconductor material on top of which a gate structure will be later fabricated. Semiconductor layer 16 has a thickness of 10 nm or less, and will hereafter also be referred to as extremely thin semiconductor-on-insulator (ETSOI) layer 16.

FIG. 1 illustrates the result of multiple processing steps to produce a substrate that contains an ETSOI layer 16 of thickness 10 nm or less and a buried oxide layer 14. A second semiconductor layer 12 is located underneath the buried oxide layer 14, and is illustrated as semiconductor layer 12 in FIG. 1.

In an embodiment, ETSOI layer 16 is a silicon layer. In other embodiments, ETSOI layer can be any other semiconductor material, including but not limited to strained silicon, germanium, silicon alloys, germanium alloys, and the like. It can also be a combination of semiconductor materials. The ETSOI layer 16 can be manufactured to the desired thickness by any known method, including but not limited to, grinding, etching, and planarizing.

Buried oxide layer 14 present below ETSOI layer 16 and above second semiconductor layer 12 can be formed by any known technique. In an embodiment, second semiconductor layer 12 can be formed by deposition prior to the formation of ETSOI layer 16. In another embodiment, wafer bonding can be used, as is known in the art.

Second semiconductor layer 12 can be any semiconductor material, including but not limited to strained silicon, germanium, silicon alloys, germanium alloys, and the like. It can also be a combination of semiconductor materials.

FIG. 1 represents an ETSOI wafer as is known in the art. The embodiment shown here is not intended to be limiting, and any other ETSOI setup as is known in the art can be used to manufacture a semiconductor device according to the present invention.

Figure 2:
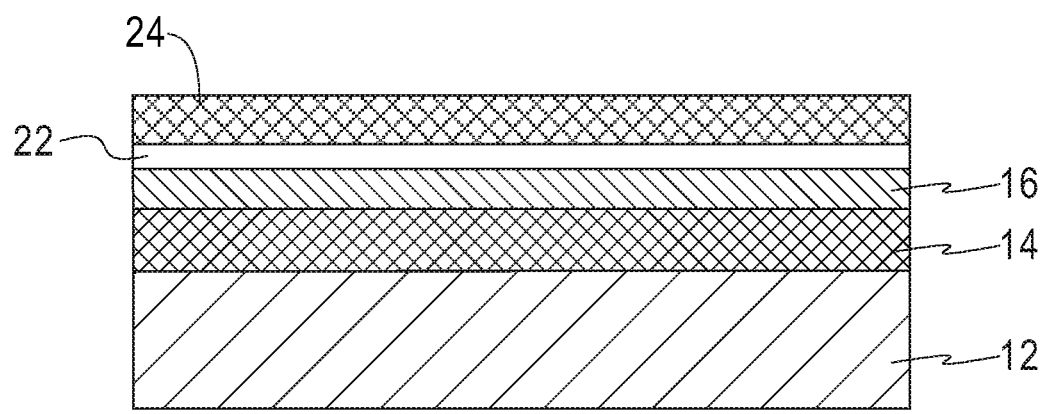
FIG. 2 is a cross-sectional view of an ETSOI substrate with pad layers added according to an embodiment of the present invention.

FIG. 2 depicts the ETSOI setup with two additional layers added. In an embodiment, layer 22 is a thin thermal silicon dioxide layer acting as a pad layer, at a thickness ranging from 30-80 Å.

Also depicted in FIG. 2 is a pad nitride layer 24. In an embodiment, pad nitride layer 24 is silicon nitride, and is deposited to an overall thickness of 30 to 150 nm. It can be deposited by any technique as is known in the art, including but not limited to thermal chemical vapor deposition (TCVD), rapid thermal chemical vapor deposition (RTCVD), physical vapor deposition (PVD), and low pressure chemical vapor deposition (LPCVD).

Figure 3:
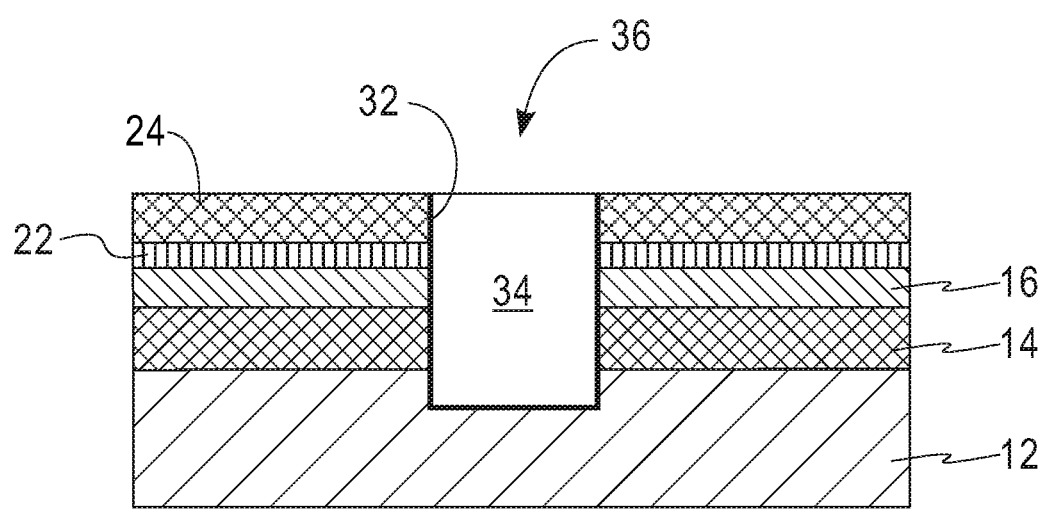
FIG. 3 is a cross-sectional view of an STI etched into the ETSOI substrate according to an embodiment of the present invention.

Referring now to FIG. 3, the shallow trench isolation (STI) 36 is defined. The dimensions of the trench formed are relevant to the size of the device and highly dependent on the technology for which the device is being used. As illustrated in FIG. 3, the STI can be formed by selectively removing portions of the pad nitride 24, the thermal silicon dioxide layer 22, the ETSOI layer 16, the buried oxide layer 14, and into the second semiconductor layer 12. In an embodiment, the shallow trench isolation is formed by known techniques of lithography, masking and etching.

Additionally, a liner 32 is present on the walls and bottom of STI 36. In an embodiment, the liner 32 is thermally grown silicon dioxide. In other embodiments, liner 32 is deposited using any number of known deposition techniques, including, CVD, LPCVD, plasma enhanced CVD (PECVD), and atomic layer deposition (ALD).

In a next processing step, a dielectric 34 is deposited in STI 36. In this embodiment, silicon dioxide is used to fill the trench left behind by the STI definition steps. The STI 36 is completely filled, with overfill to ensure that the entire trench is filled with silicon dioxide 34. The dielectric material is deposited using any number of known techniques so that the STI 36 is reliably filled, including CVD, sub atmospheric pressure CVD (SACVD), and spin-on.

At this stage of manufacture, the silicon dioxide now creates a filled trench 36. Thereafter, the shallow trench is planarized using, for example, chemical mechanical polishing (CMP). Pad nitride layer 24 acts as a stop layer for the CMP process, and results in a smooth surface, where the top layer of the silicon dioxide 34 is continuous with the top layer of the pad oxide 24. FIG. 3 depicts the device at the completion of these steps.

Figure 4:
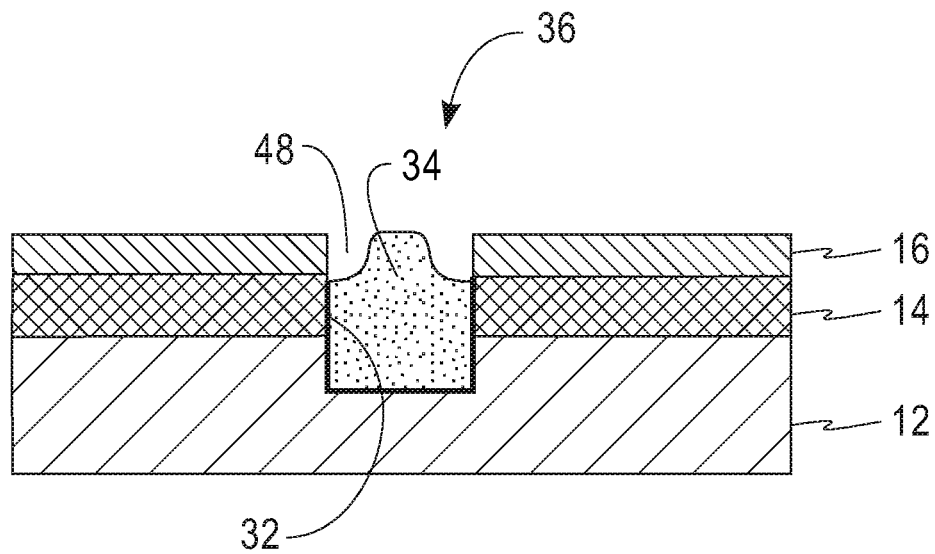
FIG. 4 is a cross-sectional view of the device with a dielectric added to the STI according to an embodiment of the present invention.

Referring now to FIG. 4, the manufacturing process continues with several etching steps. In a first etching step, the pad nitride layer 24 is etched selective to the other layers. In an embodiment, hot phosphoric acid is used to etch silicon nitride layer 24 selective to the oxide layers.

In a subsequent processing step, a second etching step is performed to remove the oxide layers. In this embodiment, a hydrofluoric acid (HF) etch is used to etch the silicon dioxide layer 22 and the silicon dioxide film 32. In addition, this HF etch step also etches some of the silicon dioxide material 34 that fills the trench 36. This is noted as 48 in FIG. 4, where it can be seen that the HF etch has eroded some of the silicon dioxide and formed a divot on either side.

Figure 5:
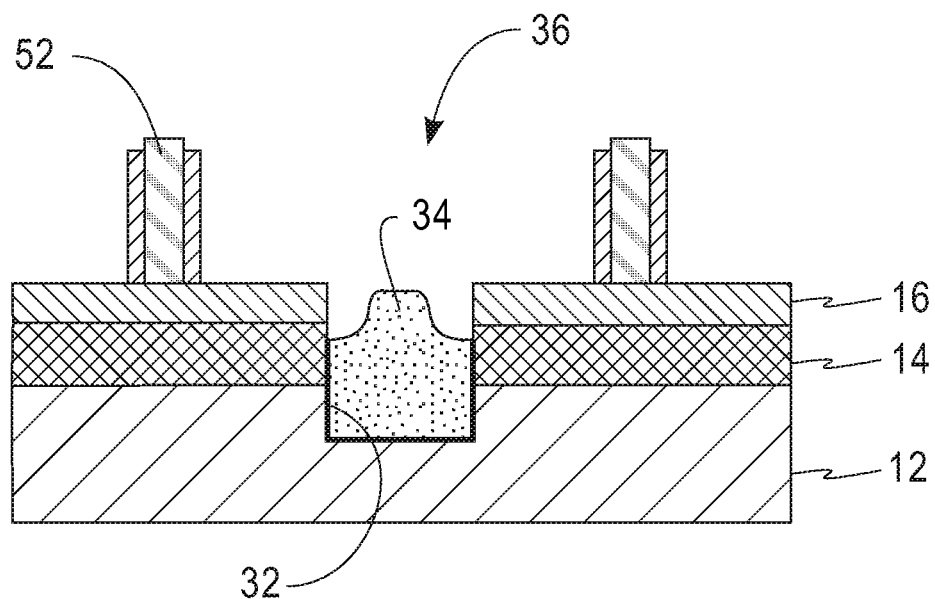
FIG. 5 is a cross-sectional view of the device with gate structures added according to an embodiment of the present invention.

Referring now to FIG. 5, a gate structure 52 is constructed on top of ETSOI layer 16. Gate structure 52 can be manufactured according to any known methods in the art. The following example is of one embodiment of a gate structure that can be formed on top of ETSOI layer and is in no way intended to be limiting.

When using a gate first embodiment, the following method can be used to form a gate structure 52 directly on top of the ETSOI layer 16. The method uses standard techniques of deposition, lithography and etching. In an embodiment a dielectric material such as silicon dioxide is deposited over the ETSOI layer. In an embodiment using a high-k dielectric, a high-k dielectric material is deposited over the ETSOI layer. The high-k dielectric can include but is not limited to hafnium oxide, hafnium silicate, hafnium silicon oxynitride, zirconium silicate, zirconium oxide, and the like. The high-k material can be deposited by any number of known techniques, including ALD or a CVD technique, such as metal organic chemical vapor deposition (MOCVD) or atomic layer chemical vapor deposition (ALCVD). The dielectric material is typically deposited to an overall thickness ranging from 1 nm to 10 nm.

In a subsequent deposition, a metal gate layer is deposited on top of the dielectric. The metal gate layer can be any metal including but not limited to titanium, titanium nitride, nickel, nickel, copper, silver, gold, platinum, iron, and the like.

After the deposition of the metal gate electrode, a second conductive material can be deposited over the device, such as polysilicon, doped polysilicon, and the like.

A pattern is created over the deposited materials by first applying a photoresist to the surface to be etched. Next the photoresist is exposed to a pattern of radiation which is developed into the desired pattern using a resist developer. This allows removal of the photoresist in areas that overly the portions of the device that are to be etched. After the completion of the patterning, the portions covered by the photoresist are protected from etching while the uncovered regions are etched using a selective etching process.

Sidewall spacers can be formed after the selective etching process and in direct contact with the sidewalls of the gate structure. The spacer can be formed by deposition and etching steps, as is known in the art. For example, an anisotropic etching process can be used, such as reactive ion etching.

In an embodiment, raised source and drain regions can be formed adjacent to the sidewall spacers and on top of the ETSOI layer by a selective epitaxial growth process, as is known in the art. In one embodiment, an in-situ doped semiconductor material is formed using the epitaxial growth process. Using this method, extension regions are formed below the raised source and drain regions by diffusing dopant from the raised source and drain regions into the underlying ETSOI layer.

Silicides are next formed on top of the raised source and drain regions. Silicide formation can be done typically by depositing a metal on top of the silicon surface. In a next step, annealing is performed to react the deposited metal with the silicon surface, forming a metal silicide. The annealing process can be performed by any known method, including rapid thermal annealing. After the reaction, a metal silicide is formed and the unreacted metal that remains is removed by a selective etching process.

Other embodiments using a gate first approach will also work for purposes of this invention. Specifically, methods using diffusion doping and ion implantation to form source and drain regions can be used. It is not limited to these, however, and any gate first approach as known in the art can be used.

Alternatively, a gate last approach can be used. In this process, a dummy gate is deposited as a placeholder, and will later be removed to make room for the metal gate. The dummy gate can be formed by known techniques of deposition, lithography and selective etching. Similar to the gate first approach, a dielectric is first deposited. This step is followed with the deposition of a dummy gate material, such as polysilicon. The device is then patterned using the same method of the previously described gate first approach.

Although other steps or processes can be performed after the completion of the aforementioned steps, this embodiment continues with the formation of a spacer. To form the spacer, a conformal layer of spacer material is applied over the entire dummy gate, including the entire length of the sidewalls. In the same process step, the spacer material is applied over any other exposed portion of the device. In an embodiment, the conformal layer of spacer material is silicon nitride. The spacer material can be deposited by any number of known techniques, including CVD, LPCVD, PECVD, and the like.

In a next processing step, the spacer material is etched by an anisotropic etch to remove any spacer material from the top of the dummy gate as well as any other horizontal surface. In an embodiment, this anisotropic etch is done by reactive ion etching. This leads to the formation of a spacer on the sides of the dummy gate.

In this embodiment, source and drain regions are formed at this stage of manufacturing. This can be done by known methods, for example by an epitaxial growth process used to form raised source and drain regions, as explained previously.

In subsequent processing steps, the dummy gate is removed and replaced with a metal gate. A wet etch can be used to remove the dummy gate selective to the rest of the device materials.

Throughout the creation of the gate structure 52, numerous wet cleans are performed, lowering the level of the dielectric 34 and extending the divot 48 deeper towards the substrate. Eventually, this can leave semiconductor layer 12, buried oxide layer 14 and ETSOI layer 16 all at least partially exposed. In this embodiment, the sidewall of the buried oxide layer 14 is above the divot 48 of the dielectric 34, such that the sidewall of the semiconductor layer 12 is exposed.

The preceding examples of gate structures are not meant to be limiting, and any method of building a gate structure over an ETSOI layer as is known in the art can be used.

Figure 6:
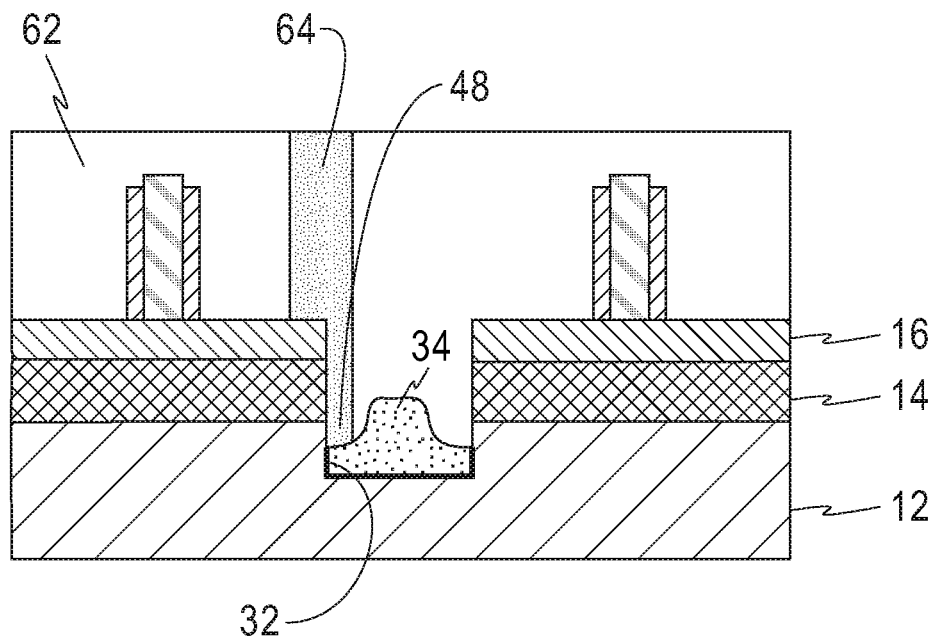
FIG. 6 is a cross-sectional view of the device with an insulating material added and a hole etched according to an embodiment of the present invention.

Referring now to FIG. 6, a pre-metal dielectric 62 is deposited uniformly over the entire device. In an embodiment, a high-density plasma oxide is used as the pre-metal dielectric, and it is deposited, for example, by high-density plasma chemical vapor deposition. In another embodiment, spin on glass is deposited over the device as the pre-metal dielectric. In another embodiment, silicon dioxide is deposited over the device. Other dielectric materials can also be used as the pre-metal dielectric.

In a next processing step, the surface of the pre-metal dielectric is smoothed. In an embodiment, this is done by CMP until very flat, resulting in a uniform top surface.

After completion of the chemical mechanical polishing, contact holes 64 are opened up in the dielectric to the source and drain regions. During this step, in some cases, the contact holes that are opened are not fully landed (i.e. they overlap with the shallow trench so that part of the hole stops on the source/drain region and part of the hole etches into the pre-metal dielectric in the shallow trench). As is illustrated in FIG. 6, the contact hole 64 is not fully landed, overlaps with the shallow trench, and is etched up until the dielectric 34. In this case, there is an unwanted hole created in the pre-metal dielectric contained within the shallow trench, leaving the sidewall of the substrate 12, buried oxide 14 and ETSOI 16 exposed.

To create the contact holes, a standard lithography and etching process can be used. In an embodiment, a dry etch is performed that etches the oxide (i.e. the pre-metal dielectric) selective to the nitride and silicon. The contact holes opened are typically created with a circular or rectangular cross-sectional shape. Regardless of the geometry of the contact holes, they are typically 5 to 25 nm in diameter. In other embodiments, they can be up to 100 nm in diameter.

Figure 7:
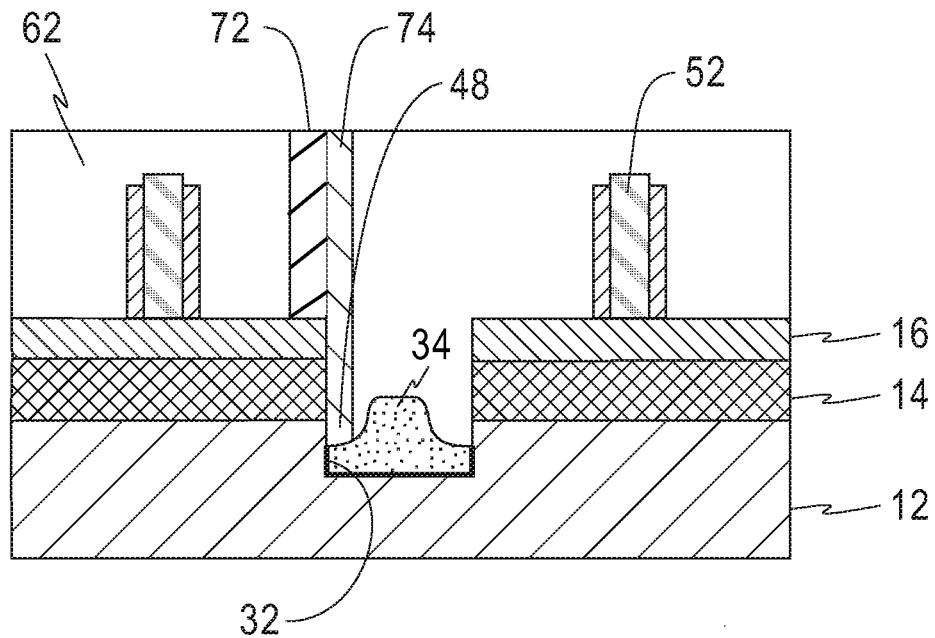
FIG. 7 is a cross-sectional view of the device with a conformal film added to the etched hole sidewalls according to an embodiment of the present invention.

Referring now to FIG. 7, the contact hole 64 previously created is filled with a film. In one embodiment, a conformal film is deposited on the sidewalls. In this embodiment, the film extends outward from the sidewalls, filling the hole, and creating a seam where the material from one sidewall will come in contact with the material from the opposite sidewall. This is illustrated as conformal film 72 and 74, where both represent the same material deposited using the same process, but extended from opposite walls. The material used as the conformal film must have properties that are different from the pre-metal dielectric so that the conformal film can later be etched selective to the pre-metal dielectric. In an embodiment using silicon dioxide as the pre-metal dielectric, silicon nitride can be used as the conformal film. Silicon nitride can be later etched selective to the silicon dioxide using a spacer etch.

Various deposition techniques can be used to deposit a conformal film on the sidewalls. In one embodiment, CVD is used as the deposition technique. In other embodiment, variations of CVD, such as LPCVD or molecular layer deposition (MLD), can be used as the deposition technique.

For example, in an embodiment where the contact hole diameter is 50 nm, a conformal film 25 nm in height can be deposited on the sidewalls. This will ensure that the hole below the ETSOI layer 16 is completely filled and the conformal layers extending from opposite walls will connect.

In another embodiment, a planar film can be laid down, for example a planar film of silicon nitride. With either the conformal film embodiment or the planar film embodiment, the hole below at and below the ETSOI layer 16 is completely filled.

Figure 8:
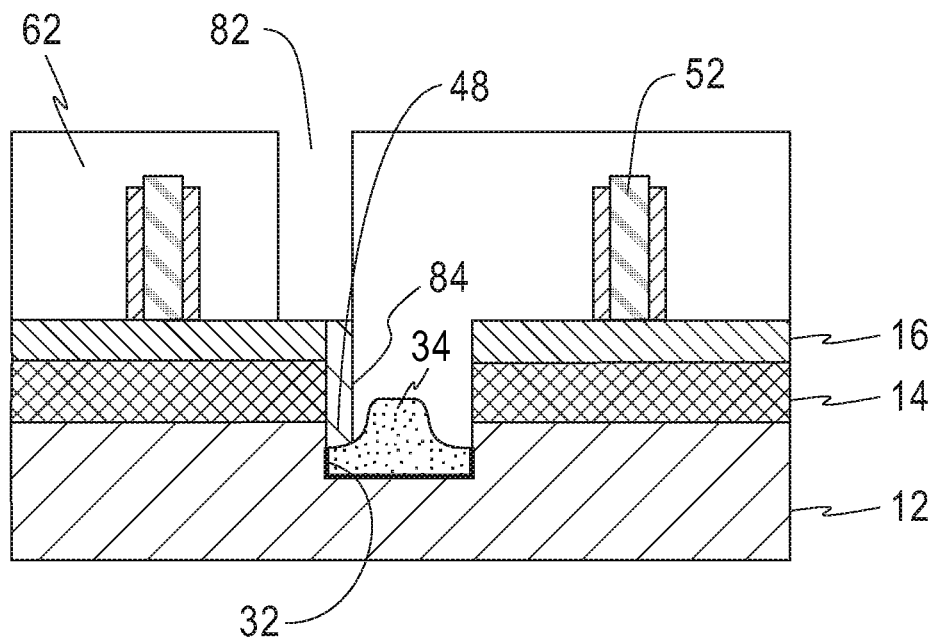
FIG. 8 is a cross-sectional view of the device with the conformal film partially recessed according to an embodiment of the present invention.

Referring now to FIG. 8, the film 72 and 74 is partially recessed, leaving remaining film 84. This process equalizes the first semiconductor layer 16 and the remaining film 84, so that there is not height difference from one to the other. In one embodiment, a wet etch is used, for example hot phosphoric acid. In other embodiment, a dry etch can be used, for example a spacer etch in an embodiment using silicon nitride as the film, as is known in the art. The etching process is tightly controlled, for example by performing a timed etch. The invention is not limited to these etching techniques, and any etching process known in the art that can etch part of the film selective to the pre-metal dielectric 62 is suitable.

At the completion of the previous etching step, a void 82 is opened up above the ETSOI layer 16 where the film was previously present. Below the top of the ETSOI layer 16, the film remains, hereafter referred to as the remaining film 84. In addition to plugging the hole and preventing later added metal from filling it, the remaining film 84 also prevents epitaxial growth of thin films on the sidewall, which can cause unwanted electrical connections. This epitaxial growth includes, but is not limited to Si, SiGe, SiP, SiCP, and the like.

Figure 9:
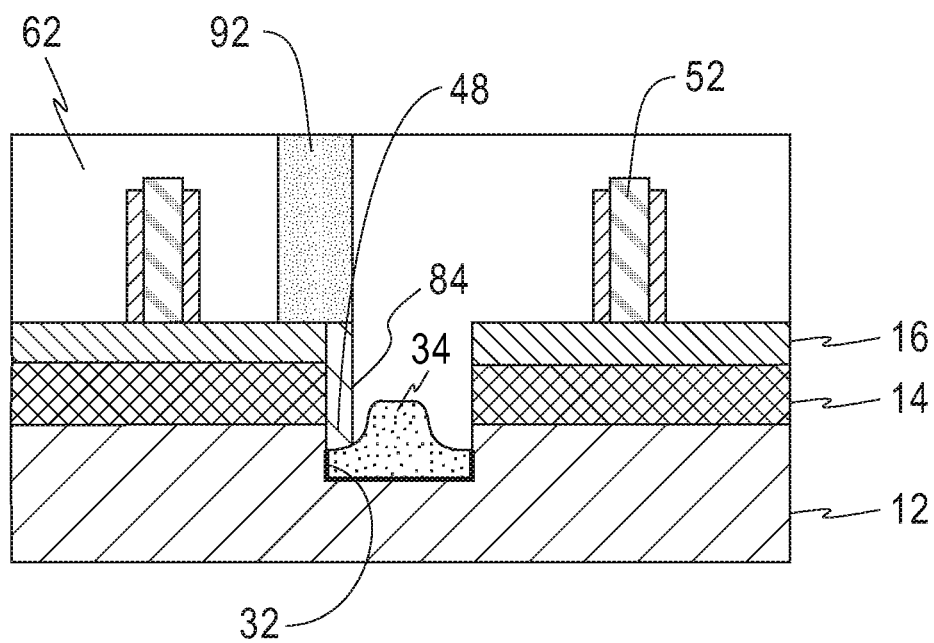
FIG. 9 is a cross-sectional view of the device with a metal contact added according to an embodiment of the present invention.

Referring now to FIG. 9, the void 82 is filled with a metal. Typically, when metal is added to a contact hole that is not fully landed, it will fill the area 84, creating unwanted electrical connections between the substrate and the source/drain. Since the area 84 has been filled with a film, the metal only fills the void 82. Any metal suitable for creating a metal contact as is known in the art can be used as the metal contact 92.

After the deposition of the metal 92, the surface is smoothed. In an embodiment, CMP is performed to smooth the surface.

The method as described above is used in the fabrication of integrated circuit chips. In an embodiment, many field effect transistors are fabricated by this method, separated by at least one shallow trench isolation, and electrically connected to form an integrated circuit.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a semiconductor device, comprising:
    providing a wafer including a plurality of regions comprising at least a first semiconductor layer overlying a buried oxide layer overlying a second semiconductor layer;
    forming one or more pad layers over the wafer;
    forming a trench in the wafer, the trench extending through the first semiconductor layer, through the buried oxide layer, and partially into the second semiconductor layer;
    filling the trench with a first dielectric so as to form a shallow trench isolation;
    removing the one or more pad layers, wherein the removal of the one or more pad layers results in partial removal of the first dielectric so as to create a divot at a side of the shallow trench isolation;
    forming a gate structure directly over the first semiconductor layer, wherein following the forming the gate structure, the divot extends into the first dielectric of the shallow trench isolation so as to expose sidewalls of the first semiconductor layer, the buried oxide layer, and the second semiconductor layer;
    depositing a second dielectric uniformly over the semiconductor device, including the divot;
    etching a hole adjacent and parallel to the gate structure into the second dielectric, wherein the hole is not fully landed and extends at least partially into the shallow trench isolation so as to re-expose at least a portion of the divot; and
    depositing an insulating material film that can be etched selective to the second dielectric in the hole, wherein at least the portion adjacent to and below said first semiconductor layer the exposed portion of the divot is completely filled to the first semiconductor layer.

2. The method according to claim 1, wherein the first semiconductor layer has a thickness of less than 10 nm.

3. The method according to claim 1, wherein the depositing the insulating material film in the hole further comprises:
    depositing a conformal layer of insulating material on sidewalls of the hole sidewalls until the hole and the divot are completely filled;
    etching the conformal layer of insulating material selective to the second dielectric to equalize the first semiconductor layer and the conformal layer of insulating material;
    depositing a metal into the hole; and
    performing a chemical mechanical polish over the semiconductor device.

4. The method according to claim 3, wherein the conformal layer of insulating material is silicon nitride.

5. The method according to claim 1, wherein the depositing the insulating material film in the hole further comprises:
    depositing a planar layer of insulating material in the hole and the divot until the hole is completely filled;
    etching the planar layer of insulating material selective to the second dielectric to equalize the first semiconductor layer and the insulating material;
    depositing a metal into the hole; and
    performing a chemical mechanical polish over the semiconductor device.

6. The method according to claim 5, wherein the planar layer of insulating material is silicon nitride.

7. The method according to claim 1, wherein the hole has a cross sectional geometry selected from the group consisting of circular and rectangular.

8. The method according to claim 1, wherein a layer of silicon dioxide with a thickness in a range of 1 to 2 nm is in between the first dielectric and a shallow trench isolation sidewall.

9. The method according to claim 1, wherein the forming the gate structure comprises forming a gate structure by a gate first method.

* * * * *